(12) United States Patent
Segal et al.

(10) Patent No.: US 12,020,974 B2
(45) Date of Patent: Jun. 25, 2024

(54) CIRCULAR WAFER LATERAL POSITIONING DEVICE

(71) Applicant: Core Flow Ltd., Daliyat el-Karmel (IL)

(72) Inventors: Alon Segal, Kiriyat Tivon (IL); Daniel Yahides, Kiryat Motzkin (IL); Yaacov Legerbaum, Haifa (IL)

(73) Assignee: Core Flow Ltd., Daliyat el-Karmel (IL)

(*) Notice: Subject to any disclaimer, the term of this patent is extended or adjusted under 35 U.S.C. 154(b) by 216 days.

(21) Appl. No.: 17/437,005

(22) PCT Filed: Mar. 11, 2020

(86) PCT No.: PCT/IL2020/050284
§ 371 (c)(1),
(2) Date: Sep. 7, 2021

(87) PCT Pub. No.: WO2020/183464
PCT Pub. Date: Sep. 17, 2020

(65) Prior Publication Data
US 2022/0181191 A1   Jun. 9, 2022

Related U.S. Application Data

(60) Provisional application No. 62/817,605, filed on Mar. 13, 2019.

(51) Int. Cl.
*H01L 21/687* (2006.01)

(52) U.S. Cl.
CPC .. *H01L 21/68728* (2013.01); *H01L 21/68707* (2013.01); *H01L 21/68764* (2013.01)

(58) Field of Classification Search
CPC .............. H01L 21/68; H01L 21/67259; H01L 21/68728; H01L 21/68707; H01L 21/68764; Y10S 414/136
See application file for complete search history.

(56) References Cited

U.S. PATENT DOCUMENTS 4,407,627 A  * 10/1983 Sato ..................... G03F 7/7075
                                               414/757
7,256,132 B2   8/2007 Lerner et al.
(Continued)

FOREIGN PATENT DOCUMENTS

| EP | 1253633 | 10/2002 |
| JP | 2004515073 | 5/2004 |

(Continued)

OTHER PUBLICATIONS

International Search Report for PCT Application No. PCT/IL2020/050266 mailed on Jun. 9, 2020.

*Primary Examiner* — Gregory W Adams
(74) *Attorney, Agent, or Firm* — PEARL COHEN ZEDEK LATZER BARATZ LLP

(57) ABSTRACT

A wafer positioning device includes at least one fixed stop that is positioned at a periphery of a clamped position on a surface of a chuck and an extendible finger. A finger extension mechanism extends the finger outward toward a center of the chuck surface, and retracts the finger away from the center of the chuck surface. The finger is configured, when a wafer is placed on the chuck surface and the finger extension mechanism is operated to extend the finger outward, to push the wafer laterally toward the fixed stop until an edge of the wafer contacts the fixed stop when a distal end of the finger is at the periphery of the clamped position.

4 Claims, 5 Drawing Sheets

(56) References Cited

U.S. PATENT DOCUMENTS

| | | | |
|---|---|---|---|
| 7,499,767 B2* | 3/2009 | Kurita | ............... H01L 21/67265 |
| | | | 414/935 |
| 10,790,179 B2* | 9/2020 | Lee | ....................... H01L 21/681 |
| 2002/0064450 A1 | 5/2002 | Commer et al. | |
| 2003/0135302 A1 | 7/2003 | Hung et al. | |
| 2008/0203636 A1* | 8/2008 | Schenck | ........... H01L 21/68728 |
| | | | 269/25 |
| 2017/0345684 A1* | 11/2017 | Hohenwarter | .... H01L 21/67115 |

FOREIGN PATENT DOCUMENTS

| | | |
|---|---|---|
| JP | 2004253808 | 9/2004 |
| JP | 2011187938 | 9/2011 |
| JP | 6267203 | 1/2018 |
| JP | 2018120935 | 8/2018 |
| WO | WO2010/088501 | 8/2010 |

\* cited by examiner

CIRCULAR WAFER LATERAL POSITIONING DEVICE

CROSS-REFERENCE TO RELATED APPLICATIONS

This application is a U.S. National Phase Application of PCT International Patent Application No. PCT/IL2020/050284 International Filing Date Mar. 11, 2020, claiming the benefit of U.S. Provisional Patent Application No. 62/817,605, filed Mar. 13, 2019, which are hereby incorporated by reference.

FIELD OF THE INVENTION

The present invention relates to wafer processing. More particularly, the present invention relates to a device for lateral positioning of a circular wafer.

BACKGROUND OF THE INVENTION

Many processes in the manufacture of semiconducting wafers require exact positioning of sequentially processed wafers at repeatable locations. Typically, semiconductor wafers have a circular shape, e.g., as a result of slicing the wafer from a typically crystalline material that is grown in the form of a cylindrical boule. Such precise positioning enables repeatability in processing to produce various types of products. Various processing steps may be applied to an exposed surface of the wafer when precisely positioned, e.g., for the production of reliable semiconductor-based electronic components.

Many devices have been described to enable precise positioning that can position a wafer in the direction normal to its face with high repeatability. Such devices include various types of chucks, as well as noncontact support surfaces. For example, a noncontact support surface, e.g., that includes interspersed ports for outflow of pressurized air (or another fluid) and application of suction, may exhibit a fluidic spring effect that maintains the wafer at required height.

SUMMARY OF THE INVENTION

There is thus provided, in accordance with an embodiment of the invention, a wafer positioning device including: at least one fixed stop that is positioned at a periphery of a clamped position on a surface of a chuck; an extendible finger; and a finger extension mechanism to extend the finger outward toward a center of the chuck surface, and to retract the finger away from the center of the chuck surface, wherein the finger is configured, when a wafer is placed on the chuck surface and the finger extension mechanism is operated to extend the finger outward, to push the wafer laterally toward the at least one fixed stop until an edge of the wafer contacts the at least one fixed stop when a distal end of the finger is at the periphery of the clamped position.

Furthermore, in accordance with an embodiment of the invention, the periphery of the clamped position is circular.

Furthermore, in accordance with an embodiment of the invention, the at least one fixed stop includes a pin that extends outward from a plane of the surface of the chuck.

Furthermore, in accordance with an embodiment of the invention, the pin extends substantially perpendicularly to the surface of the chuck.

Furthermore, in accordance with an embodiment of the invention, the at least one fixed stop includes two pins at different azimuthal positions on the periphery of the clamped position.

Furthermore, in accordance with an embodiment of the invention, the at least one pin includes polyether ether ketone (PEEK).

Furthermore, in accordance with an embodiment of the invention, the finger extension mechanism includes a rotatable arm and a rotation mechanism for rotating the arm, the finger attached to the arm such that operation of the rotation mechanism to rotate the arm in one direction extends the finger outward toward the center of the chuck surface, and operation of the rotation mechanism to rotate the arm in an opposite direction retracts the finger away from the center of the chuck surface, Furthermore, in accordance with an embodiment of the invention, the arm is coupled to a rotatable column.

Furthermore, in accordance with an embodiment of the invention, a proximal end of the arm is coupled to the rotatable column.

Furthermore, in accordance with an embodiment of the invention, the rotation mechanism is pneumatically operated.

Furthermore, in accordance with an embodiment of the invention, the rotation mechanism is connected to two pneumatic inlets, wherein application of pressurized gas to one of the pneumatic inlets causes rotation mechanism to rotate the arm in the one direction, and application of pressurized gas to the other pneumatic inlet causes rotation mechanism to rotate the arm in the opposite direction.

Furthermore, in accordance with an embodiment of the invention, the rotation mechanism and arm are configured such that when the arm is rotated such as the finger is fully extended when no wafer is placed on the chuck surface, the distal end of the finger is within the periphery of the clamped position.

Furthermore, in accordance with an embodiment of the invention, the arm is flexible and resilient.

Furthermore, in accordance with an embodiment of the invention, the arm includes a U-shaped bend.

Furthermore, in accordance with an embodiment of the invention, the arm includes two substantially parallel finger arms or a spiral arm.

Furthermore, in accordance with an embodiment of the invention, the rotation mechanism and arm are configured such that when the arm is rotated such as the finger is fully retracted, the distal end of the finger is outside of the periphery of the clamped position.

Furthermore, in accordance with an embodiment of the invention, a housing of the arm includes a distal projection to limit lateral movement of the wafer over the chuck surface when the finger is fully retracted.

Furthermore, in accordance with an embodiment of the invention, the device includes the chuck.

Furthermore, in accordance with an embodiment of the invention, the finger extension mechanism includes a longitudinally translatable arm, the finger being attached to the arm by an elastic element.

Furthermore, in accordance with an embodiment of the invention, the finger extension mechanism includes an arm with two legs, a foot at a proximal end of one of the legs being fixed, and a foot at a proximal end of the other leg being linearly translatable.

BRIEF DESCRIPTION OF THE DRAWINGS

In order for the present invention to be better understood and for its practical applications to be appreciated, the following Figures are provided and referenced hereafter. It should be noted that the Figures are given as examples only and in no way limit the scope of the invention. Like components are denoted by like reference numerals.

DETAILED DESCRIPTION OF THE INVENTION

Figure 1A:
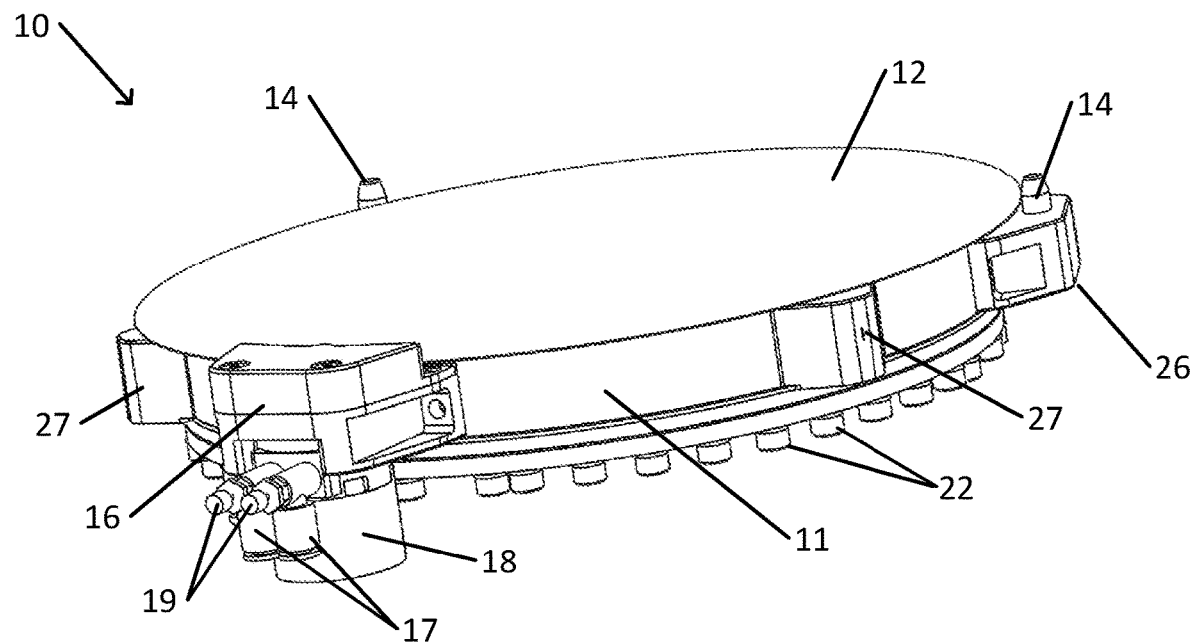
FIG. 1A schematically illustrates a circular wafer lateral positioning device, in accordance with an embodiment of the present invention.

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium (e.g., a memory) that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently. Unless otherwise indicated, the conjunction "or" as used herein is to be understood as inclusive (any or all of the stated options).

In accordance embodiments of the present invention, a device is provided to laterally position a circular wafer with high repeatability, without applying excessive compressive forces to the wafer. Typically, a surface of the wafer that is to be processed may be supported at a precise height (e.g., in a dimension that is perpendicular to the plane of a surface of the wafer that is to be processed) by a chuck, e.g., that includes a noncontact support surface or other surface that enables at least limited lateral sliding of the wafer over the chuck surface. For example, when positioning the wafer, fluid pressure (e.g., air pressure) may be applied via a face of the chuck on which the wafer rests in order to reduce friction between the wafer and the chuck face. After the wafer has been laterally positioned, suction may be applied via the chuck face in order to hold the wafer to the chuck face. In other examples, concurrent application of pressure and suction via pressure and vacuum ports that are interspersed on the chuck surface may form a fluidic spring that holds the wafer at a precise height above the chuck face.

As used herein, lateral movement or positioning of the wafer refers to movement or positioning dimensions that are substantially parallel to the plane of the surface of the wafer that is exposed or to which processing is to be applied. A lateral position of the wafer at which the lateral positioning device is configured to hold the wafer is referred to herein as the clamped position of the wafer. As used herein, a chuck refers to any surface that may support a wafer when being positioned by a lateral positioning device as described herein. Although reference is made herein to lateral positioning of a wafer, a device as described herein may be utilized to laterally position any circular object with a flat face that is supported by the chuck. Thus, any reference herein to a wafer should be understood as referring to any such object (and not necessarily a semiconductor wafer). although lateral positioning of a circular wafer is described, a device as described herein may be utilized, possibly with some limitations (e.g., particular orientations of the wafer or object), to laterally position a wafer or object with polygonal, oval, or other noncircular shape.

The lateral wafer positioning device includes one or more static components in the form of fixed stops that are located at, or that extend to, two or more different azimuthal locations on the circular perimeter of the clamped position of the wafer. Thus, the fixed stops are positioned to be tangent an edge of a wafer that is held in the clamped position.

For example, each fixed stop may include a pin that extends outward from the plane of the surface of the chuck, e.g., perpendicularly or at another angle to the surface of the chuck.

Alternatively or in addition, a single azimuthally elongated (e.g., arced) fixed stop may extend about the perimeter of the clamped position to at least two azimuthally separated locations about the perimeter of the clamped position, e.g., so as to be tangent to at least two different points on the edge of a wafer that is held in the clamped position.

A movable component is movable radially inward or outward over the surface of the chuck. Typically, the movable component is in the form of a finger that is positioned near the periphery of the clamped position, and that is extendable inward toward the center of the chuck surface, and retractable outward away from the center of the chuck surface. In some cases, more than one moveable component may be provided. For example, two or more fingers may be positioned at azimuthally separated locations along the periphery of the chuck surface. In some cases, the device may include three or more fingers without any fixed stops.

Alternatively or in addition, the movable component may be azimuthally elongated about the periphery of the clamped position. When the elongated movable component is moved inward, the movable component may contact the edge of the wafer at two or more different locations. In this case, the fixed stop may include a single fixed stop that is located substantially diametrically opposite the movable component. In some cases, the device may include two or more elongated movable components and no fixed stops.

An adjustable finger assembly that includes an extendable finger is located at another different (from the fixed stops) azimuthal location on the perimeter of the clamped position. The finger is movable between an open position where the finger is maximally retracted distal to the clamped position, and a closed position in which the finger is maximally extended. When the finger is maximally extended and no wafer is present on the chuck, the finger is extended proximally to within the perimeter of the clamped position.

The finger is mounted on a flexible arm, such that when a wafer is present on the chuck and finger assembly is in the closed state, the finger pushes against a lateral edge of the wafer. The pushing pushes the wafer against the fixed stops. When the wafer has been pushed against the fixed stops, the wafer is at the clamped position. Thus, when the finger assembly is in the closed state, the perimeter of the wafer abuts the fixed stops and the finger at the perimeter of the clamped position, being tangent to the wafer at the clamped position.

Typically, at least a part of each of the fixed stops and finger that is configured to contact the wafer may be made of a material that does not interfere with processing of the wafer. For example, a material for use in the fixed stops and fingers may be a material that does not degrade at temperatures at which the wafer is processed, and that has antistatic properties. Examples of suitable materials include polyether ether ketone (PEEK), another thermoplastic material, or another material.

The lateral forces that are applied to the circular edge of the wafer by the finger and the fixed stops are directed laterally inward at the tangent points. The lateral forces are configured to be sufficient to hold the wafer at the clamped position during processing of the wafer. In addition, tangentially applied friction forces may resist rotation of the wafer. The flexibility of the arm may ensure that the force that is exerted by the finger on the edge of the wafer does not exceed a predetermined maximum force. For example, the predetermined maximum force may be selected so as to ensure that the wafer is held in position with no risk of bending or warping of the wafer.

For example, the finger assembly may include a rotatable column to which a proximal end of the flexible arm is attached. The finger is mounted on a distal portion of the arm and extends laterally outward (toward the center of the chuck surface) from the arm. The column may be rotated by a motorized or other mechanism. In one example, the column may be rotated in one direction by application of pneumatic pressure (e.g., via one port) to one end of a rotatable vane that is connected to the column. The direction of rotation may be reversed by application of pneumatic pressure to the other end of the vane (e.g., via a different port). Other mechanical, electromagnetic, pneumatic, hydraulic, or other mechanisms may be utilized to rotate the column.

Rotation of the column in one direction may rotate the arm such that the distal end of the arm with the finger is extended toward the clamped position. Rotation of the column in the opposite direction may rotate the arm so that the finger at the distal end is rotated outward, retracting the finger away from the clamped position.

The column may be provided with stops that prevent rotation of the arm beyond a predetermined range of rotation angles. For example, the stops may include tabs that extend outward from the column. When the tabs contact projections in a housing of the finger assembly, the exerted force may resist further rotation of the column in that direction. A connection of the column to a motor or other mechanism that provides a torque for rotation the column may include a clutch mechanism to release the connection when further rotation is prevented. Alternatively or in addition, electrical or electronic circuitry may prevent further rotation of the column past an allowed range of rotation angles. For example, rotation to the end of the rotational range may operate a mechanical switch, or an optical, electronic, electromagnetic, or other mechanism to stop operation of a motor, disconnect a transmission mechanism, or otherwise stop rotation of the column.

Figure 1B:
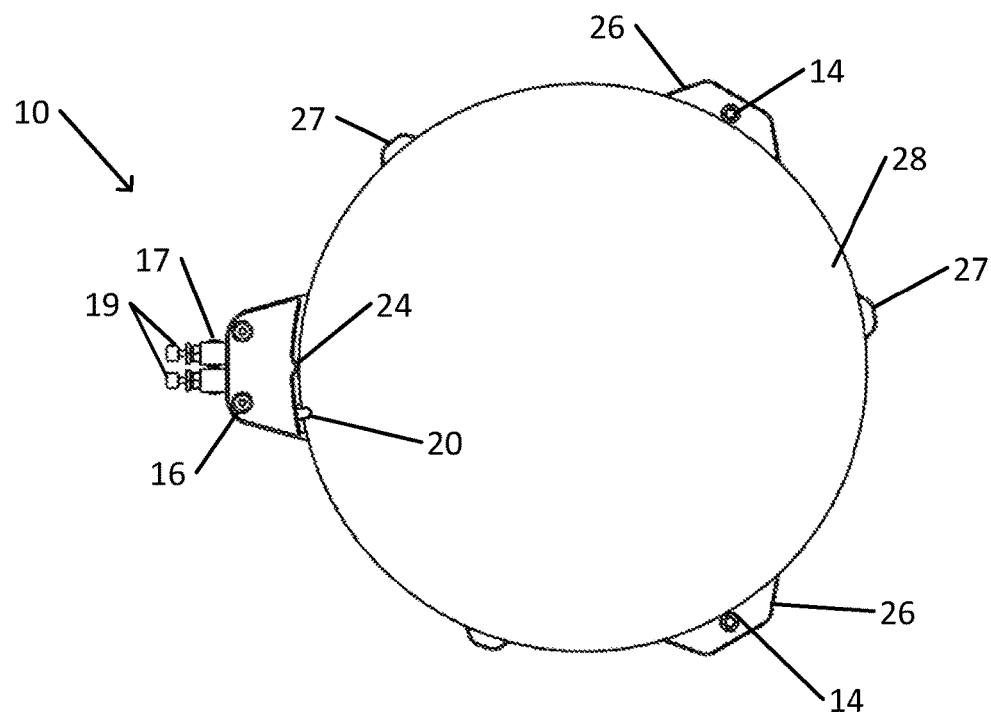
FIG. 1B is a schematic top view of the circular wafer lateral positioning device shown in FIG. 1A.
Figure 1C:
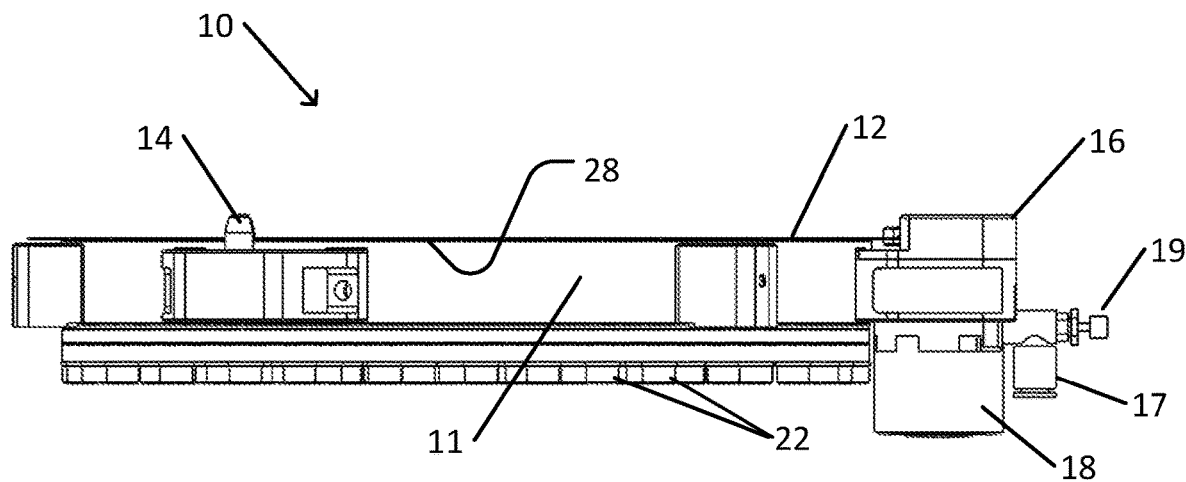
FIG. 1C is a schematic side view of the circular wafer lateral positioning device shown in FIG. 1A.

FIG. 1A schematically illustrates a circular wafer lateral positioning device, in accordance with an embodiment of the present invention. FIG. 1B is a schematic top view of the circular wafer lateral positioning device shown in FIG. 1A. FIG. 1C is a schematic side view of the circular wafer lateral positioning device shown in FIG. 1A.

Circular wafer positioning device 10 is configured to hold circular wafer 12 at a clamped position on chuck surface 28 of chuck head 11. For example, circular wafer positioning device 10 and chuck head 11 may be mounted to supporting fixture using one or more of mounting projections 27, bolts 22, or otherwise.

For example, chuck surface 28 may include a noncontact platform that exhibits a fluidic spring effect that maintains a fixed distance (typically a fixed height) between circular wafer 12 and chuck surface 28. In this case, wafer support surface 28 may include an arrangement of interspersed pressure and vacuum ports that are connected to one or more sources of fluidic pressure and suction. In another example, pressure may be applied via openings in chuck surface 28 in order to reduce friction during lateral positioning of circular wafer 12 on chuck surface 28, followed by application of suction in order to hold circular wafer 12 to chuck surface 28. In other examples, chuck surface 28 may include another suitable type of surface (e.g., a surface that is coated with a nonstick material).

In the example shown, circular wafer positioning device 10 includes two fixed stops 14 at different azimuthal locations about chuck surface 28. Finger assembly 16 is located at a third azimuthal location, different from the azimuthal locations of fixed stops 14. In the example shown, the two fixed stops 14 and finger assembly 16 are approximately equally spaced around the circumference of chuck surface 28, at approximately 120° intervals. In other examples, the device may include more than two fixed stops 14, and the azimuthal separation may be more or less than 120° (e.g., but less than 180°). Finger 20 may be extended out of finger assembly 16 in order to hold circular wafer 12 at a clamped position, where circular wafer 12 is held tangent to at least two fixed stops 14 and to a distal end of finger 20. Prior to extension of finger 20, movement of circular wafer 12 may be limited by distal projection 24 on finger assembly 16.

Figure 2:
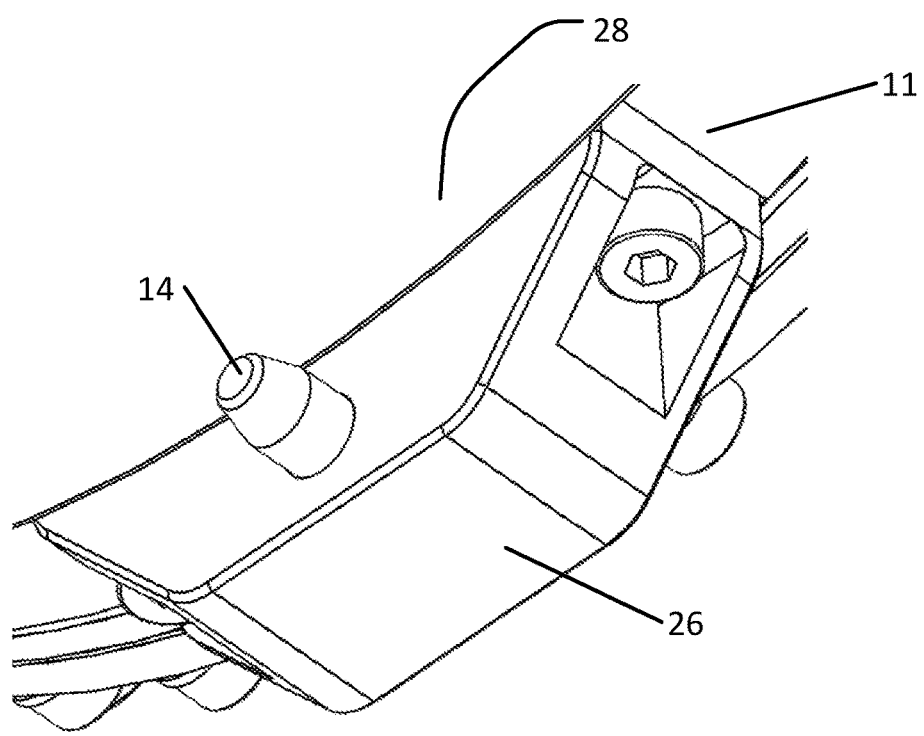
FIG. 2 schematically illustrates a fixed stop of the circular wafer lateral positioning device shown in FIG. 1A.

FIG. 2 schematically illustrates a fixed stop of the circular wafer lateral positioning device shown in FIG. 1A.

In the example shown, fixed stop 14 is in the form of a pin that is mounted on stop base 26, which is in turn mounted to a side of chuck head 11. Each fixed stop 14 extends perpendicularly to the plane of chuck surface 28.

Each fixed stop 14 is sufficiently rigid to prevent outward movement of a circular wafer 12 that abuts that fixed stop 14. Each fixed stop 14 may be constructed out of or coated with a material whose contact with circular wafer 12 does not risk damaging or marring circular wafer 12 (e.g., by preventing scratching, cracking, or other types of damage) or interfering with processing of circular wafer 12 (e.g., by preventing buildup of static electrical charges, by preventing unwanted conduction of heat, or other interference with processing). For example, a fixed stop 14 may include, or may be coated with, PEEK or another suitable material. Similarly, at least a distal end of finger 20 may be made of or be coated with a similar material, such as PEEK.

Figure 3:
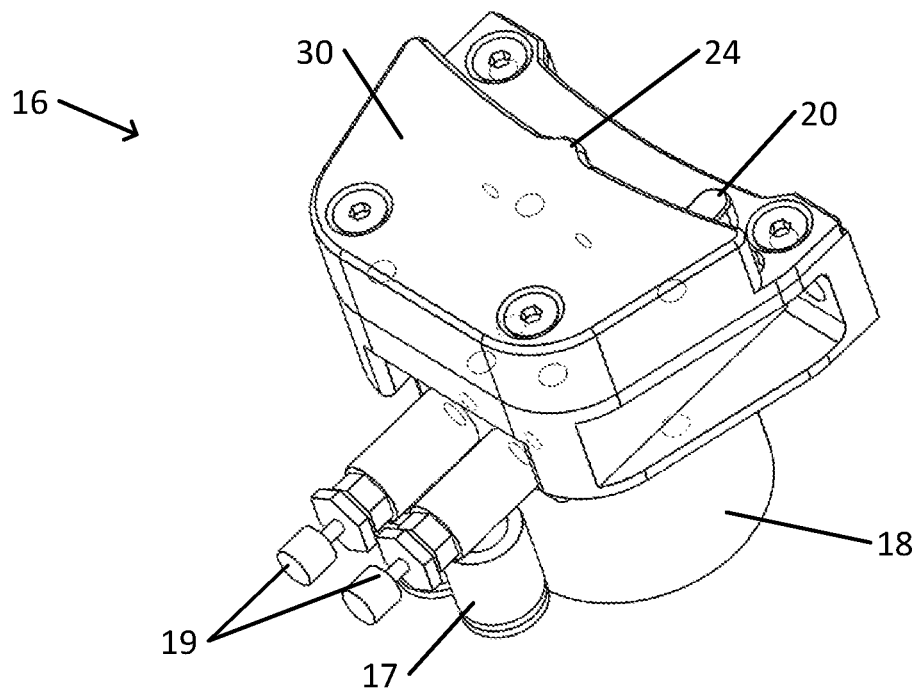
FIG. 3 schematically illustrates a finger assembly of the circular wafer lateral positioning device shown in FIG. 1A.

FIG. 3 schematically illustrates a finger assembly of the circular wafer lateral positioning device shown in FIG. 1A.

In the example shown, components of a mechanism for extending or retracting finger 20 of finger assembly 16 is enclosed within assembly cover 30. Extension or retraction of finger 20 is effected by operation of column rotation mechanism 18 to rotate a rotatable column 40 (visible in FIG. 4) to which finger 20 is connected.

In the example shown, column rotation mechanism 18 may be pneumatically operated, e.g., by applying gas pressure to either one of pneumatic inlets 17. For example, an elongated vane may be connected to rotatable column 40 within column rotation mechanism 18. Pneumatic pressure that is provided through one of pneumatic inlets 17 may apply a force to one end of the vane, thus providing a torque to rotate the column in one direction. Pneumatic pressure that is provided through the other pneumatic inlet 17 may apply a force to the opposite end of the vane, providing a torque to rotate the column in the opposite direction. Valves 19 (e.g., in the form of needle valves or other types of valves) may be operated to adjust a pneumatic inflow through each pneumatic inlet 17. Adjustment of the inflow may enable efficient operation of a pneumatically operated column rotation mechanism 18.

Alternatively or in addition, column rotation mechanism 18 may include another mechanism for rotating a column to which finger 20 is connected. For example, column rotation mechanism 18 may include an electric motor, or another rotation mechanism. In such cases, an electrical connection or other control or power supply component may replace pneumatic inlets 17 and valves 19.

In the example shown, assembly cover 30 includes distal projection 24. Distal projection 24 may be configured to limit lateral movement of a circular wafer 12 over chuck surface 28 when finger 20 is retracted or not fully extended. The limiting of lateral movement may facilitate lateral positioning of circular wafer 12 by circular wafer positioning device 10 when extending finger 20.

Figure 4:
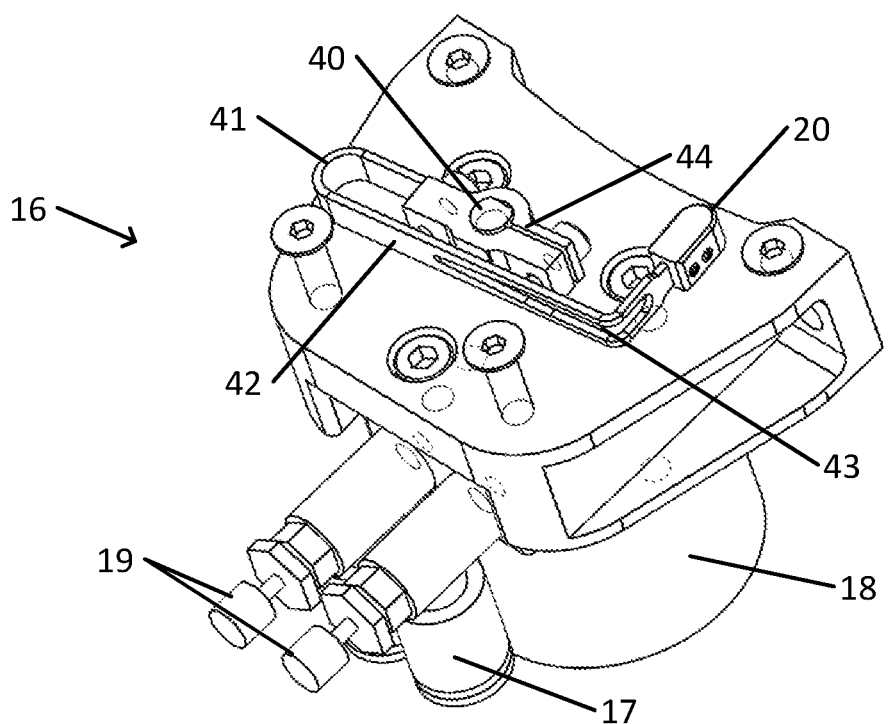
FIG. 4 schematically illustrates the finger assembly shown in FIG. 3 with its cover removed.

FIG. 4 schematically illustrates the finger assembly shown in FIG. 3 with its cover removed.

In the example shown, rotatable column 40 is rotatable by operation of column rotation mechanism 18. For example, rotatable column 40 may represent an end of a drive column that is rotated by a vane, motor, or other torque-generating mechanism of column rotation mechanism 18. In another example, rotatable column 40 may be coupled to a separate drive column by a transmission mechanism. The drive column may be directly driven to rotate by the torque-generating mechanism of column rotation mechanism 18. The transmission mechanism may include one or more gears, belts, or other mechanism for transmitting a torque from the drive column to rotatable column 40.

Column rotation mechanism 18 typically includes a mechanism for limiting rotation of rotatable column 40, or of a drive column to which rotatable column 40 is coupled. For example, a typical rotational range within which rotatable column 40 is enabled to rotate may be less than 90°. The rotation limiting mechanism may include tabs, stops, or other projections on rotatable column 40 (or on a drive column or on a component of a transmission) that are configured to engage corresponding structure within column rotation mechanism 18 to limit rotation of rotatable column 40 past an end of the allowed rotational range. The corresponding structure may include a mechanical projection that physically prevents further rotation of a projection past the limiting rotation angle. In other examples, the projection may operate a switch to turn off a motor or disengage a transmission when the projection is rotated to a limiting angle. In other examples, the limiting mechanism may include an optical, electromagnetic, electronic, or other mechanism for detecting rotation of rotatable column 40 to or past a limiting rotation angle. In some cases, e.g., where column rotation mechanism 18 includes an electric motor, a transmission may include a clutch mechanism to enable the drive column to disengage from rotatable column 40 when further rotation of rotatable column 40 is mechanically prevented.

In the example shown, a proximal end of finger arm 42 is clamped to rotatable column 40 by arm clamp 44. Alternatively or in addition, finger arm 42 may be otherwise connected to rotatable column 40. For example, finger arm 42 may be connected to rotatable column 40 by one or more screws or clips, by insertion into a groove or opening in rotatable column 40, by welding or adhesives, or otherwise. In other examples, finger arm 42 may be directly rotated by a rotation mechanism.

Finger 20 is mounted at a distal end of finger arm 42. Finger arm 42 extends laterally outward from finger assembly 16 in a direction that is substantially perpendicular to the direction in which finger arm 42 extends from rotatable column 40. Thus, rotation of finger arm 42 in one direction (counterclockwise in the example shown) extends finger 20 outward toward the center of chuck surface 28. Rotation of finger arm 42 in the opposite direction retracts finger 20 away from the center of chuck surface 28.

In other examples, finger 20 may be otherwise connected to finger arm 42. For example, finger 20 may extend longitudinally from an end of finger arm 42, or at an oblique angle to finger arm 42. Finger arm 42 may be otherwise connected to rotatable column 40, or to another type of finger extension mechanism (e.g., a longitudinal translation mechanism or another mechanism operable to extend or retract finger 20. Finger 20 may extend from a point of finger arm 42 that is distal to arm clamp 44 but proximal to the distal end of finger arm 42.

Column rotation mechanism 18 may be configured such that when finger 20 is maximally extended (e.g., when rotatable column 40 is rotated to a maximum counterclockwise rotation angle in the example shown), and when no circular wafer 12 is placed on chuck surface 28, the distal end of finger 20 extends to within the perimeter of the clamped position of a circular wafer 12 on chuck surface 28. Similarly, when finger 20 is maximally retracted (e.g., when rotatable column 40 is rotated to a maximum clockwise rotation angle in the example shown), the distal end of finger 20 is withdrawn to a position that is outside the perimeter circular wafer 12 on chuck surface 28. For example, the distal end of finger 20 may be withdrawn to a radial distance from the center of chuck surface 28 that is greater than the radial distance to distal projection 24 on assembly cover 30 of finger assembly 16.

Finger arm 42 may be configured to be flexible and elastic. For example, finger arm 42 may be constructed of a material that is subjectable to multiple bending without breaking. For example, finger arm 42 may be constructed out a flat, and possibly bent, strip of metal, plastic, or another suitable material with sufficient flexibility to bend when flexed, but with sufficient stiffness and resilience to return to its original shape when the flexing force is removed. In the example shown, finger arm 42 is provided with features to facilitate elastic bending without mechanically fatiguing finger arm 42. In the example shown, finger arm 42 includes U-shaped bend 41, such that a proximal segment of finger arm 42 is substantially parallel to a distal segment of finger arm 42. A distal section of finger arm 42 includes longitudinal slot 43, substantially parallel to an elongated dimension of the distal section of finger arm 42.

Thus, when finger arm 42 is rotated to maximally extend finger 20, the outer edge of circular wafer 12 may contact the distal end of finger 20 to prevent the full extension of finger 20. As a result, the distal end of finger arm 42 near finger 20 may be bent outwardly from the center of chuck surface 28. The elasticity of finger arm 42 may thus apply a force to finger 20 to maintain a pressing force of finger 20 on circular wafer 12. The force may thus keep the outer edge of circular wafer 12 pressed against two or more fixed stops 14. The forces exerted on circular wafer 12 by finger 20 and fixed stops 14 may be sufficient to hold circular wafer 12 at the clamped position on chuck surface 28.

In some cases, finger arm 42 or other structure on which finger 20 is mounted may be rigid. In this case, finger 20 itself may be made of a flexible and resilient material so as to enable exertion of pressing force on the outer edge of circular wafer 12 when finger 20 is extended in order to hold circular wafer 12 at the clamped position on chuck surface 28.

In some cases, once the operation of finger assembly 16 and fixed stops 14 has positioned circular wafer 12 at the clamped position on chuck surface 28, suction may be applied via openings in chuck surface 28. The suction may hold circular wafer 12 to chuck surface 28. The resulting friction between chuck surface 28 and a face of circular wafer 12 that faces chuck surface 28 may be sufficient to hold circular wafer 12 in place. In this case, after application of the suction, finger assembly 16 may be operated to retract finger 20.

Thus, a circular wafer 12 may be placed on chuck surface 28 between fixed stops 14 and finger assembly 16 when finger 20 is fully retracted. Fixed stops 14 and finger 20 (or other types of fixed and movable components) may be located about the periphery of chuck surface 28 such that no space between adjacent fixed stops 14, or between finger 20 and an adjacent fixed stop 14, is larger than the diameter of circular wafer 12. Thus, if the size of circular wafer 12 is about that of chuck surface 28, an azimuthal separation between adjacent positioning components (e.g., fixed stops 14 and finger 20) cannot be larger than about 180° (or smaller, depending on the relative sizes of circular wafer 12 and chuck surface 28).

When circular wafer 12 is first placed on chuck surface 28, circular wafer 12 may be enabled to slide freely over chuck surface 28. For example, air, or another gas or fluid, may be expelled via openings on chuck surface 28 to reduce friction between circular wafer 12 and chuck surface 28. Alternatively, chuck surface 28 may include interspersed openings for concurrent application of pressure and suction to form a fluid cushion that exhibits a fluidic spring effect. Alternatively or in addition, chuck surface 28 may be made of, or coated with, a nonstick surface material.

Column rotation mechanism 18 may be operated to extend finger 20 of finger assembly 16. For example, air pressure from a pressure source may be provided to one of pneumatic inlets 17 to rotate rotatable column 40 and attached finger arm 42 to extend finger 20 outward. When the distal end of finger 20 contacts an edge of circular wafer 12, continued extension of finger 20 may push circular wafer 12 toward fixed stops 14. When circular wafer 12 is pushed to fixed stops 14, lateral motion of circular wafer 12 may stop and further extension of finger 20 may bend finger arm 42 to apply a lateral force to hold circular wafer 12 in the clamped position, tangent to fixed stops 14 and finger 20.

Once circular wafer 12 has been laterally positioned at the clamped position, where chuck surface 28 is configured to do so, friction may be increased between circular wafer 12 and chuck surface 28. For example, suction may be applied to circular wafer 12 via openings in chuck surface 28 to hold circular wafer 12 against chuck surface 28.

Processing (e.g., modification or inspection) of circular wafer 12 may then proceed. When processing is complete, circular wafer 12 may be released from chuck surface 28. For example, finger 20 may be fully retracted away from circular wafer 12. Application of suction via chuck surface 28 may cease. Circular wafer 12 may then be removed from chuck surface 28.

Typically, operation of circular wafer positioning device 10 may be controlled by a controller. The controller may include one or more units that are configured to operate in accordance with programmed instructions. For example, the controller may operate column rotation mechanism 18 to extend or retract finger 20. In some cases, the controller may also operate, or may communicate with one or more controllers that operate other functions. Thus, operation of column rotation mechanism 18 and circular wafer positioning device 10 may be coordinated with the other functions. These other functions may include one or more of applying fluid pressure, suction, or both to openings on chuck surface 28, processing of circular wafer 12, transporting a circular wafer 12 to and from chuck surface 28, or other functions related to processing of one or more circular wafers 12.

Alternatively or in addition, a wafer positioning device may include other configurations of fingers and finger extension mechanisms. In some configurations, the finger may be enabled to move in a direction that is substantially normal to chuck surface 28, e.g., to laterally position circular wafer 12 at the clamped position until circular wafer 12 is secured to chuck surface 28, e.g., by suction.

In some configurations, the finger may be enabled to move in a direction that is substantially parallel to the chuck surface.

Figure 5A:
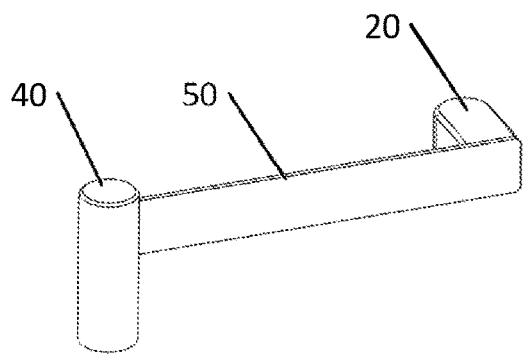
FIG. 5A schematically illustrates an example of a straight finger arm for the finger assembly shown in FIG. 4.

FIG. 5A schematically illustrates an example of a straight finger arm for the finger assembly shown in FIG. 4.

In the example shown, finger 20 is extends laterally from a distal end of straight finger arm 50, whose proximal end is attached to rotatable column 40. Straight finger arm 50 may include a single elongated arm, with a flat or other cross section, that may be flexible and resilient, e.g., to enable at least lateral bending.

Figure 5B:
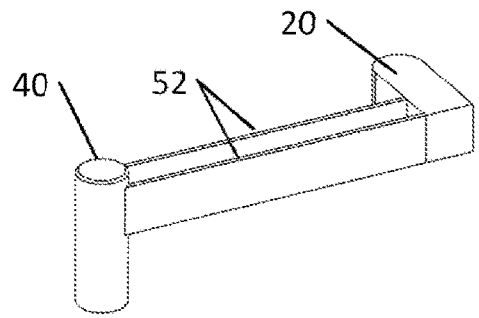
FIG. 5B schematically illustrates an example of finger arm with two straight arms.

FIG. 5B schematically illustrates an example of finger arm with two straight arms.

In the example shown, finger 20 is extends laterally from the distal ends of two straight parallel and laterally displaced finger arms 52, whose proximal ends are attached to rotatable column 40. Each finger arm 52 may have a flat (e.g., substantially perpendicular to the plane of chuck surface 28) or other cross section, and may be flexible and resilient, e.g., to enable at least lateral bending.

Figure 5C:
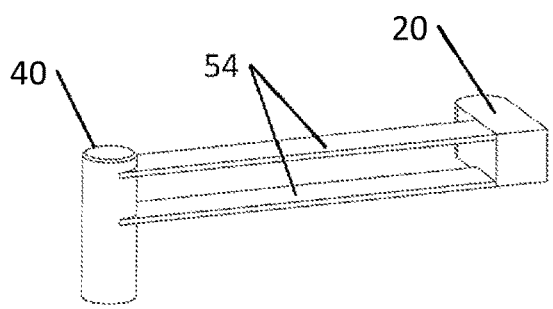
FIG. 5C schematically illustrates an example of finger arm with two flat arms at different heights relative to the plane of the chuck surface.

FIG. 5C schematically illustrates an example of finger arm with two flat arms at different heights relative to the plane of the chuck surface.

In the example shown, finger 20 is extends laterally from the distal ends of two straight parallel finger arms 54, whose proximal ends are attached to rotatable column 40. In the example shown, each finger arm 54 has a flat cross section that is substantially parallel to the plane of chuck surface 28. Finger arms 54 are displaced from one another along an axis that is perpendicular to the plane of chuck surface 28. Each finger arm 54 may be flexible and resilient, e.g., to enable at least bending in a direction perpendicular to the plane of chuck surface 28.

Figure 5D:
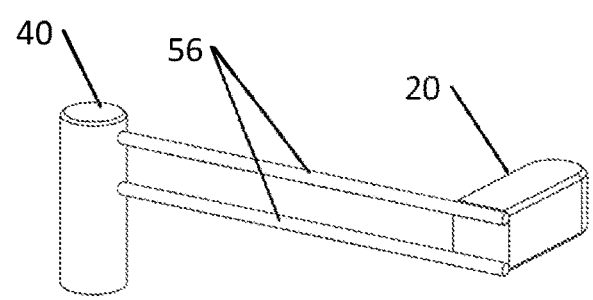
FIG. 5D schematically illustrates an example of finger arm with two arms at different heights relative to the plane of the chuck surface.

FIG. 5D schematically illustrates an example of finger arm with two arms at different heights relative to the plane of the chuck surface.

In the example shown, finger 20 is extends laterally from the distal ends of two straight parallel finger arms 56, whose proximal ends are attached to rotatable column 40. In the example shown, each finger arm 56 has a circular or other non-flat cross section. Finger arms 56 are displaced from one another along an axis that is perpendicular to the plane of chuck surface 28. Each finger arm 56 may be flexible and resilient, e.g., to enable both lateral bending and bending in a direction perpendicular to the plane of chuck surface 28.

Figure 5E:
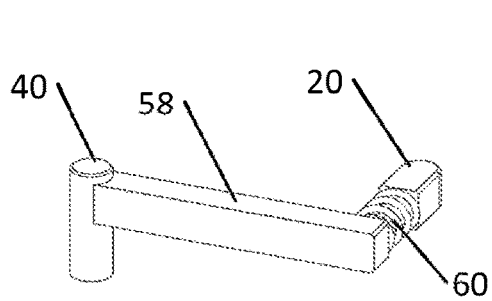
FIG. 5E schematically illustrates an example of a finger arm with a rigid arm and elastic connection to the finger.

FIG. 5E schematically illustrates an example of finger arm with a rigid arm and elastic connection to the finger.

In the example shown, finger 20 is connected by an elastic (e.g., flexible and resilient) element in the form of spring 60 to extend laterally from the distal end of rigid arm 58, whose proximal end is attached to rotatable column 40. The elastic connection to rigid arm 58 may enable finger 20 to move relative to rigid arm 58 both laterally and in a direction perpendicular to the plane of chuck surface 28.

Figure 5F:
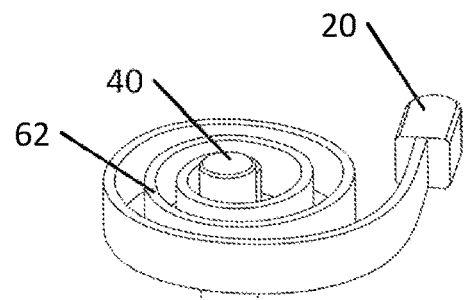
FIG. 5F schematically illustrates an example of a spiral finger arm.

FIG. 5F schematically illustrates an example of a spiral finger arm.

In the example shown, finger 20 is extends longitudinally from the distal end of spiral arm 62, whose proximal end is attached to rotatable column 40. Spiral arm 62 may be flexible and resilient, e.g., to enable both lateral bending and bending in a direction perpendicular to the plane of chuck surface 28.

Figure 5G:
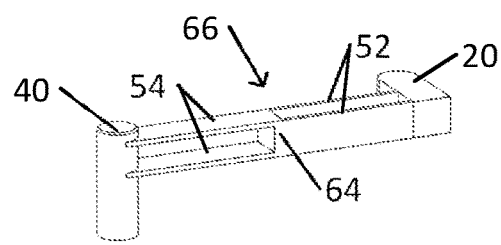
FIG. 5G schematically illustrates an example of a compound finger arm with two sections of double arms at different orientations.

FIG. 5G schematically illustrates an example of a compound finger arm with two sections of double arms at different orientations.

In the example shown, finger 20 extends laterally from the distal end of compound finger arm 66, whose proximal end is attached to rotatable column 40. In the example shown, a proximal section of compound finger arm 66 includes two finger arms 54 that are displaced from one another along an axis that is perpendicular to the plane of chuck surface 28. A distal section of compound finger arm 66 includes two straight parallel and laterally displaced finger arms 52. The proximal and distal sections connect at connector 64. Each finger arm 54 and 52 may be flexible and resilient, e.g., to enable both lateral bending and bending in a direction perpendicular to the plane of chuck surface 28.

Finger 20 may be configured to hold circular disk 12 at a predetermined distance from chuck surface 28. For example, finger 20 may include a groove or notch that is configured to guide an edge of circular disk 12 to a particular part along the distal end of finger 20.

Figure 6A:
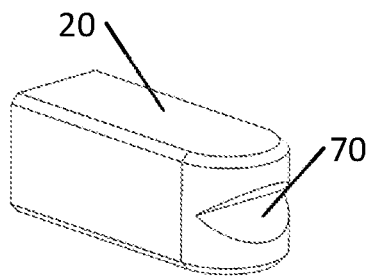
FIG. 6A schematically illustrates a finger with a V-shaped notch.

FIG. 6A schematically illustrates a finger with a V-shaped notch.

An edge of circular disk 12 that is supported on chuck surface 28 may be guided into V-shaped notch 70 on a distal end of finger 20. The edge may thus be held in V-shaped notch 70 as finger 20 is extended to move circular disk 12 to the clamped position on chuck surface 28.

Figure 6B:
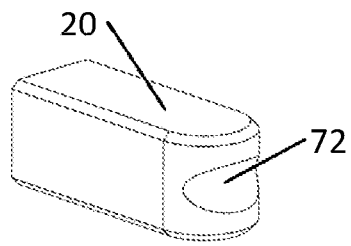
FIG. 6B schematically illustrates a finger with a U-shaped notch.

FIG. 6B schematically illustrates a finger with a U-shaped notch.

An edge of circular disk 12 that is supported on chuck surface 28 may be guided into U-shaped notch 72 on a distal end of finger 20. The edge may thus be held in U-shaped notch 72 as finger 20 is extended to move circular disk 12 to the clamped position on chuck surface 28.

Figure 7A:
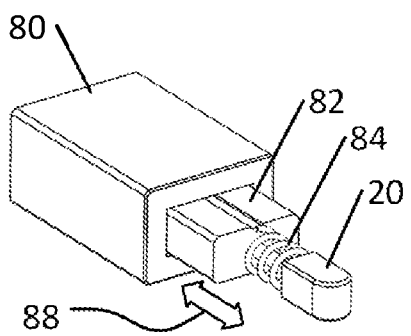
FIG. 7A schematically illustrates a linearly translatable finger arm with a linear spring connection to the finger.

FIG. 7A schematically illustrates a linearly translatable finger arm with a linear spring connection to the finger.

Extension mechanism 80 is configured to extend and retract finger arm 82 with a longitudinal motion 88. For example, extension mechanism 80 may include an electric motor (e.g., with a transmission to convert rotational motion to linear motion), an electric or electromagnetic linear actuator, or another hydraulically, pneumatically, electromagnetically, or otherwise powered mechanism. Longitudinal motion 88 may represent linear movement of a solid finger arm 82, or lengthening and shortening of a finger arm 82 of variable length (e.g., by telescoping, accordion unfolding and folding, expansion and contraction, or otherwise).

Finger 20 may be connected to finger arm 82 by an elastic element. The elastic element may facilitate maintaining contact between finger 20 and a circular disk 12, without risking damage to circular disk 12.

In the example shown, the elastic element that connects finger 20 to the distal end of finger arm 82 includes linear spring 84.

Figure 7B:
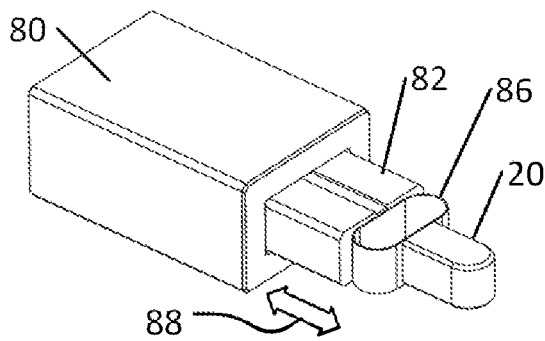
FIG. 7B schematically illustrates a linearly translatable finger arm with a leaf spring connection to the finger.

FIG. 7B schematically illustrates a linearly translatable finger arm with a leaf spring connection to the finger.

In the example shown, the elastic element that connects finger 20 to the distal end of finger arm 82 includes leaf spring 86. In the example shown, leaf spring 86 is closed. In other examples, leaf spring 86 may be open (e.g., with a U-shaped profile).

Figure 8:
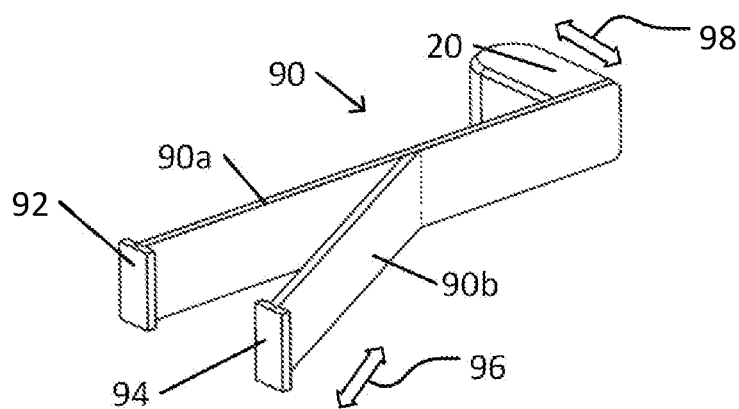
FIG. 8 schematically illustrates a compound finger arm.

FIG. 8 schematically illustrates a compound finger arm.

A fixed foot 92 at a proximal end of leg 90a of compound finger arm 90 may be attached to a fixed point on or near a finger extension mechanism. Movable foot 94 at a proximal end of leg 90b is linearly translatable to be moved outward and inward by the finger extension mechanism, as indicated by arrow 96. For example, movable foot 94 may be moved by a linear actuator, or other mechanism for generating linear bidirectional movement of movable foot 94. The outward and inward motion of movable foot 94 may cause a rocking motion of compound finger arm 90 about fixed foot 92 that may extend or retract finger 20, respectively, approximately along the direction indicated by arrow 98.

Different embodiments are disclosed herein. Features of certain embodiments may be combined with features of other embodiments; thus certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A wafer positioning device comprising:
at least one fixed stop that is positioned at a periphery of a clamped position on a surface of a chuck;
an extendible finger; and
a finger extension mechanism to extend the finger outward toward a center of the chuck surface, and to retract the finger away from the center of the chuck surface, wherein the finger is configured, when a wafer is placed on the chuck surface and the finger extension mechanism is operated to extend the finger outward, to push the wafer laterally toward said at least one fixed stop until an edge of the wafer contacts said at least one fixed stop when a distal end of the finger is at the periphery of the clamped position,
wherein the finger extension mechanism comprises a rotatable arm and a rotation mechanism for rotating the arm, the finger attached to the arm such that operation of the rotation mechanism to rotate the arm in one direction extends the finger outward toward the center of the chuck surface, and operation of the rotation mechanism to rotate the arm in an opposite direction retracts the finger away from the center of the chuck surface, wherein the rotation mechanism is pneumatically operated, and wherein the rotation mechanism is connected to two pneumatic inlets, wherein application of pressurized gas to one of the pneumatic inlets causes rotation mechanism to rotate the arm in the one direction, and application of pressurized gas to the other pneumatic inlet causes rotation mechanism to rotate the arm in the opposite direction.

2. A wafer positioning device comprising:
at least one fixed stop that is positioned at a periphery of a clamped position on a surface of a chuck;
an extendible finger; and
a finger extension mechanism to extend the finger outward toward a center of the chuck surface, and to retract the finger away from the center of the chuck surface, wherein the finger is configured, when a wafer is placed on the chuck surface and the finger extension mechanism is operated to extend the finger outward, to push the wafer laterally toward said at least one fixed stop until an edge of the wafer contacts said at least one fixed stop when a distal end of the finger is at the periphery of the clamped position,
wherein the finger extension mechanism comprises a rotatable arm and a rotation mechanism for rotating the arm, the finger attached to the arm such that operation of the rotation mechanism to rotate the arm in one direction extends the finger outward toward the center of the chuck surface, and operation of the rotation mechanism to rotate the arm in an opposite direction retracts the finger away from the center of the chuck surface
wherein the rotation mechanism and arm are configured such that when the arm is rotated such as the finger is fully extended when no wafer is placed on the chuck surface, the distal end of the finger is within the periphery of the clamped position,
wherein the arm is flexible and resilient, and
wherein the arm includes a U-shaped bend.

3. A wafer positioning device comprising:
at least one fixed stop that is positioned at a periphery of a clamped position on a surface of a chuck;
an extendible finger; and
a finger extension mechanism to extend the finger outward toward a center of the chuck surface, and to retract the finger away from the center of the chuck surface, wherein the finger is configured, when a wafer is placed on the chuck surface and the finger extension mechanism is operated to extend the finger outward, to push the wafer laterally toward said at least one fixed stop until an edge of the wafer contacts said at least one fixed stop when a distal end of the finger is at the periphery of the clamped position,
wherein the finger extension mechanism comprises a rotatable arm and a rotation mechanism for rotating the arm, the finger attached to the arm such that operation of the rotation mechanism to rotate the arm in one direction extends the finger outward toward the center of the chuck surface, and operation of the rotation mechanism to rotate the arm in an opposite direction retracts the finger away from the center of the chuck surface
wherein the rotation mechanism and arm are configured such that when the arm is rotated such as the finger is fully extended when no wafer is placed on the chuck surface, the distal end of the finger is within the periphery of the clamped position,
wherein the arm is flexible and resilient, and
wherein the arm comprises two substantially parallel finger arms or a spiral arm.

4. A wafer positioning device comprising:
at least one fixed stop that is positioned at a periphery of a clamped position on a surface of a chuck;
an extendible finger; and
a finger extension mechanism to extend the finger outward toward a center of the chuck surface, and to retract the finger away from the center of the chuck surface, wherein the finger is configured, when a wafer is placed on the chuck surface and the finger extension mechanism is operated to extend the finger outward, to push the wafer laterally toward said at least one fixed stop until an edge of the wafer contacts said at least one fixed stop when a distal end of the finger is at the periphery of the clamped position, wherein the finger extension mechanism comprises an arm with two legs, a foot at a proximal end of one of the legs being fixed, and a foot at a proximal end of the other leg being linearly translatable.

* * * * *